US009484415B2

(12) United States Patent
Ota et al.

(10) Patent No.: US 9,484,415 B2
(45) Date of Patent: Nov. 1, 2016

(54) SEMICONDUCTOR DEVICE AND METHOD FOR MANUFACTURING THE SAME

(71) Applicant: Kabushiki Kaisha Toshiba, Minato-ku (JP)

(72) Inventors: Chiharu Ota, Kawasaki (JP); Kazuto Takao, Tsukuba (JP); Johji Nishio, Machida (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 9 days.

(21) Appl. No.: 14/468,488

(22) Filed: Aug. 26, 2014

(65) Prior Publication Data

US 2015/0069416 A1    Mar. 12, 2015

(30) Foreign Application Priority Data

Sep. 12, 2013 (JP) ................................ 2013-189795

(51) Int. Cl.
*H01L 29/15* (2006.01)
*H01L 31/0312* (2006.01)
(Continued)

(52) U.S. Cl.
CPC ..... *H01L 29/1608* (2013.01); *H01L 21/02529* (2013.01); *H01L 21/02664* (2013.01); *H01L 29/36* (2013.01); *H01L 29/861* (2013.01)

(58) Field of Classification Search
CPC ............. H01L 29/1608; H01L 29/861; H01L 21/02529; H01L 29/36; H01L 21/02664
See application file for complete search history.

(56) References Cited

U.S. PATENT DOCUMENTS

| 6,091,108 A | 7/2000 | Harris et al. |
| 2003/0079676 A1 | 5/2003 | Ellison et al. |

(Continued)

FOREIGN PATENT DOCUMENTS

| EP | 1 973 165 A1 | 9/2008 |
| EP | 2 110 857 A1 | 10/2009 |

(Continued)

OTHER PUBLICATIONS

Partial European Search Report issued Jan. 22, 2015 in Patent Application No. 14181168.7.

(Continued)

*Primary Examiner* — Victor A Mandala
(74) *Attorney, Agent, or Firm* — Oblon, McClelland, Maier & Neustadt, L.L.P

(57) ABSTRACT

According to one embodiment, a semiconductor device includes a first semiconductor region, a second semiconductor region, and a third semiconductor region. The first semiconductor region includes silicon carbide. A conductivity type of the first semiconductor region is a first conductivity type. The second semiconductor region includes silicon carbide. A conductivity type of the second semiconductor region is a second conductivity type. The third semiconductor region includes silicon carbide. A conductivity type of the third semiconductor is the second conductivity type. The third semiconductor region is provided between the first semiconductor region and the second semiconductor region. As viewed in a direction connecting the first semiconductor region and the second semiconductor region, an area of an overlapping region of the second semiconductor region and the third semiconductor region is smaller than an area of an overlapping region of the first semiconductor region and the second semiconductor region.

19 Claims, 12 Drawing Sheets

(51) Int. Cl.
*H01L 29/16* (2006.01)
*H01L 29/36* (2006.01)
*H01L 21/02* (2006.01)
*H01L 29/861* (2006.01)

(56) References Cited

U.S. PATENT DOCUMENTS

| | | | |
|---|---|---|---|
| 2007/0090370 A1* | 4/2007 | Nakayama | H01L 29/045 257/77 |
| 2008/0026544 A1 | 1/2008 | Tsuchida et al. | |
| 2009/0039358 A1 | 2/2009 | Tsuchida et al. | |
| 2009/0045413 A1 | 2/2009 | Ishii et al. | |
| 2009/0047772 A1 | 2/2009 | Tsuchida et al. | |
| 2010/0032685 A1 | 2/2010 | Zhang et al. | |
| 2010/0032686 A1* | 2/2010 | Ishii | H01L 29/06 257/77 |
| 2010/0173475 A1 | 7/2010 | Tsuchida et al. | |
| 2011/0101375 A1* | 5/2011 | Zhang | H01L 29/0878 257/77 |
| 2011/0266558 A1* | 11/2011 | Yano | H01L 21/0485 257/77 |
| 2012/0122305 A1 | 5/2012 | Zhang et al. | |
| 2012/0199846 A1* | 8/2012 | Shimizu | H01L 29/66068 257/77 |
| 2013/0062620 A1* | 3/2013 | Henning | H01L 29/872 257/77 |
| 2013/0062624 A1* | 3/2013 | Tsuchiya | H01L 29/0839 257/77 |
| 2014/0034965 A1* | 2/2014 | Ota | H01L 29/0615 257/77 |
| 2014/0084303 A1* | 3/2014 | Shimizu | H01L 29/086 257/77 |
| 2014/0266403 A1* | 9/2014 | Das | H01L 29/872 327/493 |
| 2014/0361312 A1* | 12/2014 | Yoshikawa | H01L 29/41766 257/76 |
| 2015/0115285 A1* | 4/2015 | Kinoshita | H01L 29/872 257/77 |

FOREIGN PATENT DOCUMENTS

| | | |
|---|---|---|
| EP | 2 154 723 A2 | 2/2010 |
| JP | 2000-311983 | 11/2000 |
| JP | 2003-270596 A | 9/2003 |
| JP | 2008-053667 A | 3/2008 |
| JP | 2009-073734 A | 4/2009 |
| WO | WO 95/07548 A1 | 3/1995 |
| WO | WO 99/26296 A2 | 5/1999 |

OTHER PUBLICATIONS

P. A. Losee et al., "Degraded Blocking Performance of 4H-SiC Rectifiers under High dV/dt Conditions", Proceedings of the 17th International Symposium on Power Semiconductor Devices & IC's, XP-010820730, May 23-26, 2005, 4 pages.

Extended European Search Report issued Apr. 10, 2015 in Patent Application No. 14181168.7.

E. Janzen, et al., "Intrinsic defects in high-purity SiC" Microelectronic Engineering, vol. 83, No. 1, XP024954721, Jan. 1, 2006, pp. 130-134.

* cited by examiner

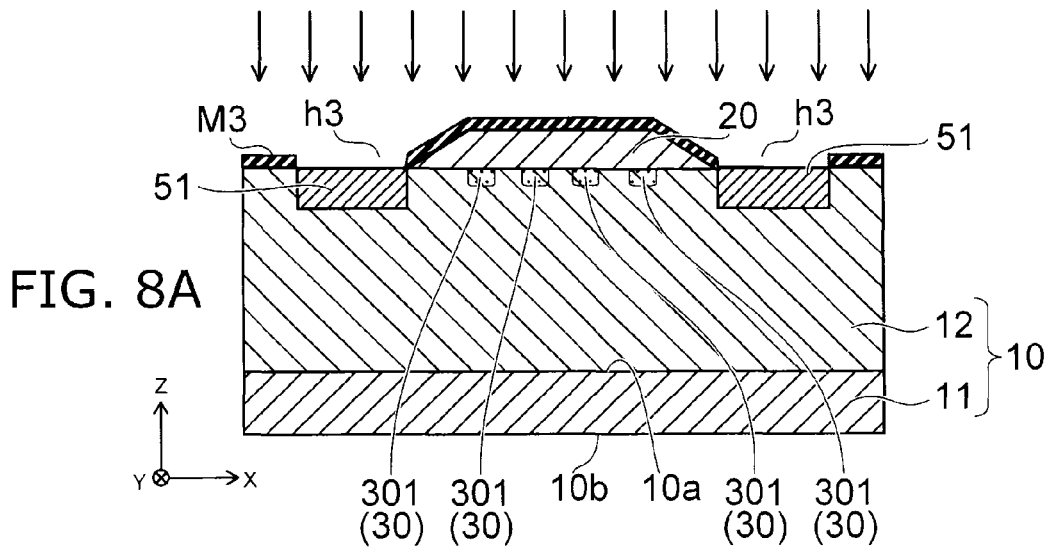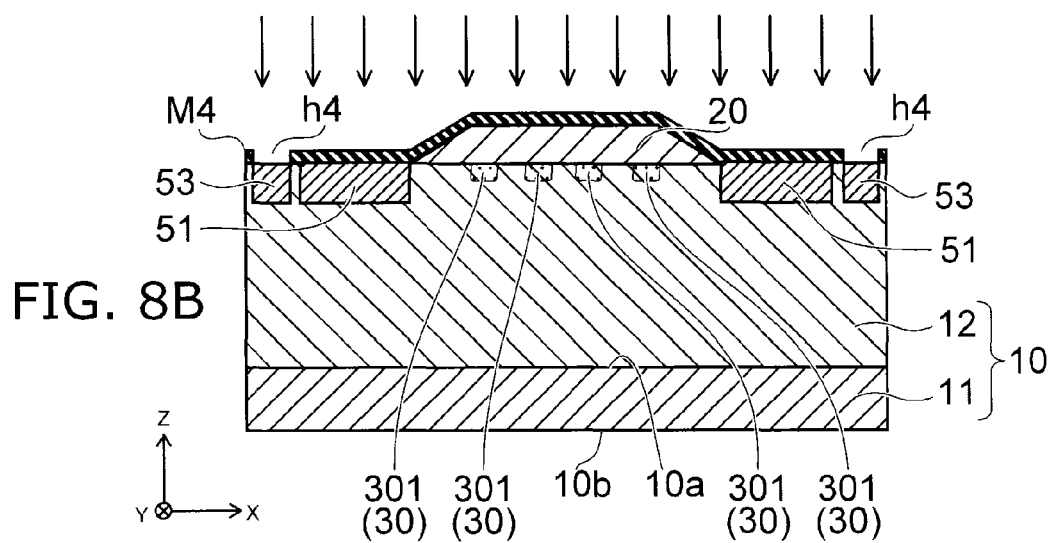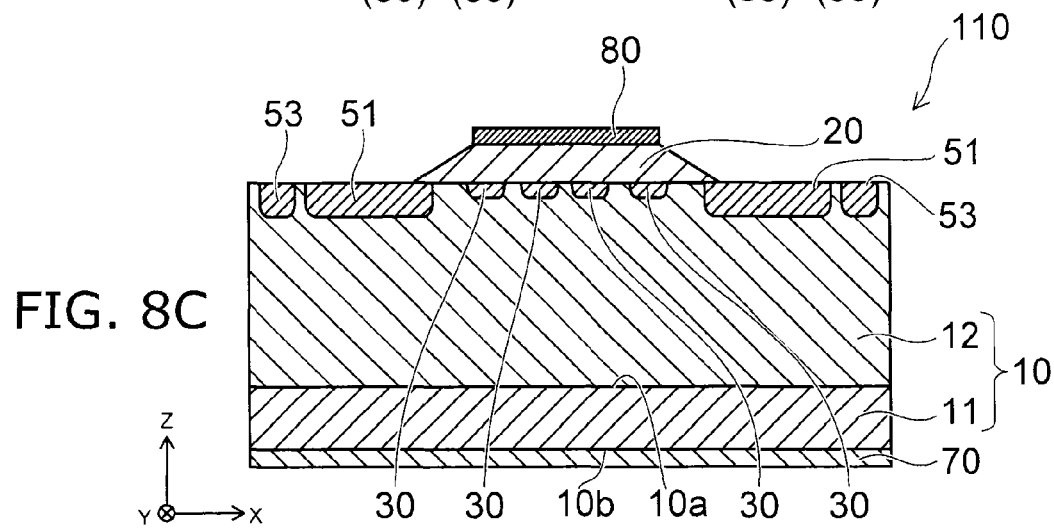

US 9,484,415 B2

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2013-189795, filed on Sep. 12, 2013; the entire contents of which are incorporated herein by reference.

FIELD

Embodiments described herein relate generally to a semiconductor device and a method for manufacturing the same.

BACKGROUND

Semiconductor devices based on silicon carbide (SiC) can be designed with lower on-resistance and higher breakdown voltage than semiconductor devices based on silicon (Si). SiC-based semiconductor devices have negative temperature characteristic in which the on-resistance decreases with the increase of temperature. Thus, in the case of using the device with a large current passed therein, an excessive current flows in the semiconductor device. In SiC-based semiconductor devices, it is important to achieve stable characteristics against the change of temperature.

BRIEF DESCRIPTION OF THE DRAWINGS

FIGS. 8A to 8C are schematic sectional views illustrating a method (I) for manufacturing a semiconductor device;

DETAILED DESCRIPTION

Figure 1:
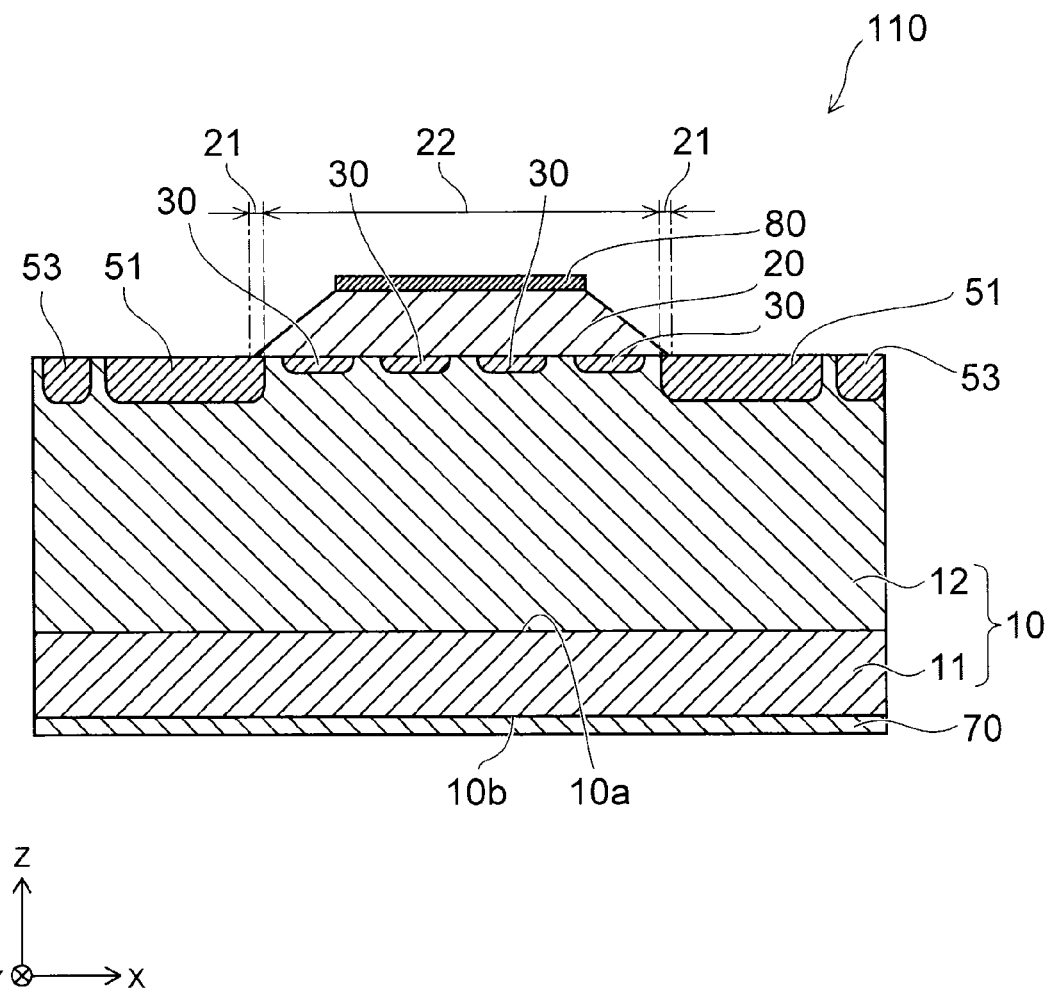
FIG. 1 is a schematic sectional view illustrating the configuration of a semiconductor device according to a first embodiment.

According to one embodiment, a semiconductor device includes a first semiconductor region, a second semiconductor region, and a third semiconductor region. The first semiconductor region includes silicon carbide. A conductivity type of the first semiconductor region is a first conductivity type. The second semiconductor region includes silicon carbide. A conductivity type of the second semiconductor region is a second conductivity type. The third semiconductor region includes silicon carbide. A conductivity type of the third semiconductor is the second conductivity type. The third semiconductor region is provided between the first semiconductor region and the second semiconductor region. As viewed in a direction connecting the first semiconductor region and the second semiconductor region, an area of an overlapping region of the second semiconductor region and the third semiconductor region is smaller than an area of an overlapping region of the first semiconductor region and the second semiconductor region.

Various embodiments will be described hereinafter with reference to the accompanying drawings. In the following description, like members are labeled with like reference numerals, and the description of the members once described is omitted appropriately. Furthermore, in the following description, by way of example, the first conductivity type is n-type, and the second conductivity type is p-type. Furthermore, in the following description, the notations of $n^+$, $n$, $n^-$ and $p^+$, $p$, $p^-$ represent relative magnitude of impurity concentration in each conductivity type. That is, $n^+$ represents relatively higher n-type impurity concentration than n, and $n^-$ represents relatively lower n-type impurity concentration than n. Similarly, $p^+$ represents relatively higher p-type impurity concentration than p, and $p^-$ represents relatively lower p-type impurity concentration than p.

First Embodiment

FIG. 1 is a schematic sectional view illustrating the configuration of a semiconductor device according to a first embodiment.

As shown in FIG. 1, the semiconductor device 110 according to the embodiment includes a first semiconductor region 10, a second semiconductor region 20, and a third semiconductor region 30. The semiconductor device 110 further includes a first electrode 70 and a second electrode 80. The semiconductor device 110 is e.g. a P-N diode.

The first semiconductor region 10 includes n-type SiC. The first semiconductor region 10 includes e.g. a substrate 11 and a first epitaxial growth layer 12 provided on the substrate 11. The substrate 11 is an $n^+$-type semiconductor region. The substrate 11 includes e.g. $n^+$-type SiC. In the embodiment, the substrate 11 includes hexagonal SiC (e.g., 4H-SiC). The substrate 11 is e.g. a SiC bulk substrate fabricated by sublimation technique.

The substrate 11 has a first surface 10a. The first surface 10a of the substrate 11 is a surface of a wafer including SiC. The first surface 10a is also a boundary surface between the substrate 11 and the first epitaxial growth layer 12. In the embodiment, the first surface 10a of the substrate 11 is inclined by more than 0 degrees and 8 degrees or less with respect to the (0001) plane, which is a hexagonal SiC surface. For instance, the substrate 11 is an off-substrate such as 2-degree off-substrate, 4-degree off-substrate, and 8-degree off-substrate. Here, the surface of the SiC substrate 11 may be either a Si surface or C surface.

The substrate 11 is doped with n-type impurity. The impurity concentration is e.g. $1 \times 10^{18}$ $cm^{-3}$ or more and $1 \times 10^{20}$ $cm^{-3}$ or less. In the embodiment, the impurity concentration is approximately $5 \times 10^{18}$ $cm^{-3}$.

The first epitaxial growth layer 12 is an $n^-$-type semiconductor layer. The first epitaxial growth layer 12 includes $n^-$-type SiC. The first epitaxial growth layer 12 is formed on the first surface 10a of the substrate 11, and has a crystal structure similar to that of the substrate 11.

The thickness of the first epitaxial growth layer 12 is determined by the design of breakdown voltage and other characteristics of the semiconductor device 110, and is e.g. approximately 200 micrometers (μm) or less. The first epitaxial growth layer 12 is doped with n-type impurity. The impurity concentration is lower than the impurity concentration of the substrate 11. The impurity concentration of the first epitaxial growth layer 12 is e.g. $1\times10^{14}$ cm$^{-3}$ or more and $1\times10^{17}$ cm$^{-3}$ or less.

The second semiconductor region 20 includes p$^+$-type SiC. The second semiconductor region 20 includes a terminal part 21 and a central part 22. The terminal part 21 is provided around the central part 22. The second semiconductor region 20 is e.g. a second epitaxial growth layer. The second semiconductor region 20 is provided on the first semiconductor region 10. For instance, the second semiconductor region 20 is provided on part of the first semiconductor region 10. The second semiconductor region 20 is formed like e.g. a mesa.

The second semiconductor region (second epitaxial growth layer) 20 is stacked on the first epitaxial growth layer 12. The thickness of the second semiconductor region 20 is e.g. approximately several μm. The second semiconductor region 20 is doped with p-type impurity. The impurity concentration is e.g. $1\times10^{17}$ cm$^{-3}$ or more and $1\times10^{21}$ cm$^{-3}$ or less.

In the embodiment, the direction connecting the first semiconductor region 10 and the second semiconductor region 20 (stacking direction) is referred to as Z-direction. One direction orthogonal to the Z-direction is referred to as X-direction. The direction orthogonal to the Z-direction and the X-direction is referred to as Y-direction. The direction from the first semiconductor region 10 toward the second semiconductor region 20 is referred to as "above" (upper side), and the opposite is referred to as "below" (lower side).

The impurity concentration of the second semiconductor region 20 may be changed in the thickness direction (Z-direction). For instance, the impurity concentration of the second semiconductor region 20 may be minimized on the first semiconductor region 10 side, and maximized on the opposite side from the first semiconductor region 10. The change of the impurity concentration may be either stepwise or continuous. By providing such change of the impurity concentration, the increase of breakdown voltage in the reverse direction due to the expansion of the spreading part of the depletion layer is made compatible with low contact resistance at the ohmic contact between the second semiconductor region 20 and the second electrode 80.

The third semiconductor region 30 is provided between the first semiconductor region 10 and the central part 22. The third semiconductor region 30 includes p-type SiC. The third semiconductor region 30 is a region formed by e.g. ion implantation of p-type impurity (e.g., aluminum (Al), boron (B)) into the portion of the first semiconductor region 10 near the junction interface between the first semiconductor region 10 and the second semiconductor region 20.

The impurity concentration of the third semiconductor region 30 is substantially equal to the impurity concentration of the second semiconductor region 20. The impurity concentration of the third semiconductor region 30 is e.g. $1\times10^{17}$ cm$^{-3}$ or more and $1\times10^{21}$ cm$^{-3}$ or less. The thickness of the third semiconductor region 30 is e.g. thicker than 0 μm and 0.6 μm or less. Here, the aforementioned thickness of the third semiconductor region 30 is the thickness on the first semiconductor region 10 side from the junction interface between the first semiconductor region 10 and the second semiconductor region. The third semiconductor region 30 may extend out from the aforementioned junction interface to the second semiconductor region 20 side.

The third semiconductor region 30 is ion-implanted (ion-doped) with p-type impurity. Thus, the amount of point defects in the third semiconductor region 30 is made larger than the amount of point defects in the first semiconductor region 10. For a larger amount of point defects, the carrier lifetime is shorter. The resistance per unit volume of the third semiconductor region 30 is higher than the resistance per unit volume of the first semiconductor region 10. The resistance of the third semiconductor region 30 is higher at a higher temperature.

For instance, as viewed in the Z-direction, the area of the overlapping region of the second semiconductor region 20 and the third semiconductor region 30 is smaller than the area of the overlapping region of the first semiconductor region 10 and the second semiconductor region 20. As projected on the X-Y plane (the plane perpendicular to the Z-direction), the area of the overlapping region of the second semiconductor region 20 and the third semiconductor region 30 is smaller than the area of the overlapping region of the first semiconductor region 10 and the second semiconductor region 20.

The semiconductor device 110 may include a termination structure region 51. For instance, the termination structure region 51 is provided so as to continuously surround the second semiconductor region 20. The termination structure region 51 is e.g. JTE (junction termination extension). Besides JTE, the termination structure region 51 may be a RESURF layer, FLR (field limiting ring), or FP (field plate). The termination structure region 51 improves the breakdown voltage by relaxing electric field concentration at the terminal when reverse biased.

The termination structure region 51 includes p-type SiC. The termination structure region 51 is formed by e.g. ion implantation of p-type impurity into the first semiconductor region 10. The impurity concentration of the termination structure region 51 is e.g. $5\times10^{16}$ cm$^{-3}$ or more and $5\times10^{18}$ cm$^{-3}$ or less. The thickness of the termination structure region 51 is e.g. 0.3 μm or more and 1.0 μm or less. In the case where the termination structure region 51 is provided, the impurity concentration of the third semiconductor region 30 is lower than the impurity concentration of the termination structure region 51. The thickness of the third semiconductor region 30 is thinner than the thickness of the termination structure region 51.

The semiconductor device 110 may include a channel stopper layer 53. For instance, the channel stopper layer 53 is provided so as to surround the termination structure region 51.

The first electrode 70 is provided on a second surface 10b on the opposite side of the substrate 11 from the first surface 10a. The first electrode 70 is e.g. a cathode electrode of the P-N diode. The first electrode 70 is in electrical continuity with the substrate 11. The first electrode 70 is in ohmic contact with the substrate 11.

The second electrode 80 is provided on the second semiconductor region 20. The second electrode 80 is e.g. an anode electrode of the P-N diode. The second electrode 80 is in electrical continuity with the second semiconductor region 20. The second electrode 80 is in ohmic contact with the second semiconductor region 20.

Here, examples of the terminal part 21 and the central part 22 of the second semiconductor region 20 are described.

Figure 2A:
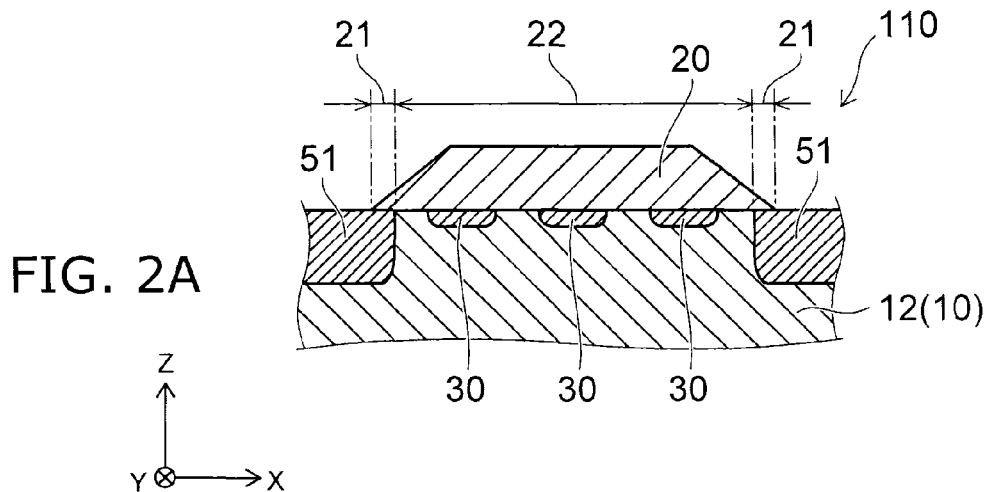
FIGS. 2A to 2C are schematic sectional views illustrating the terminal part and the central part.
Figure 2B:
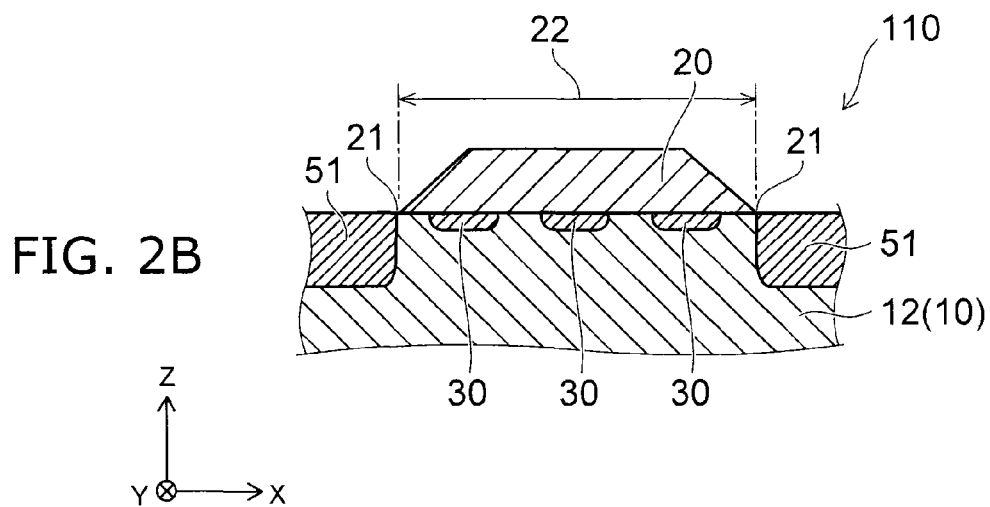
Figure 2C:
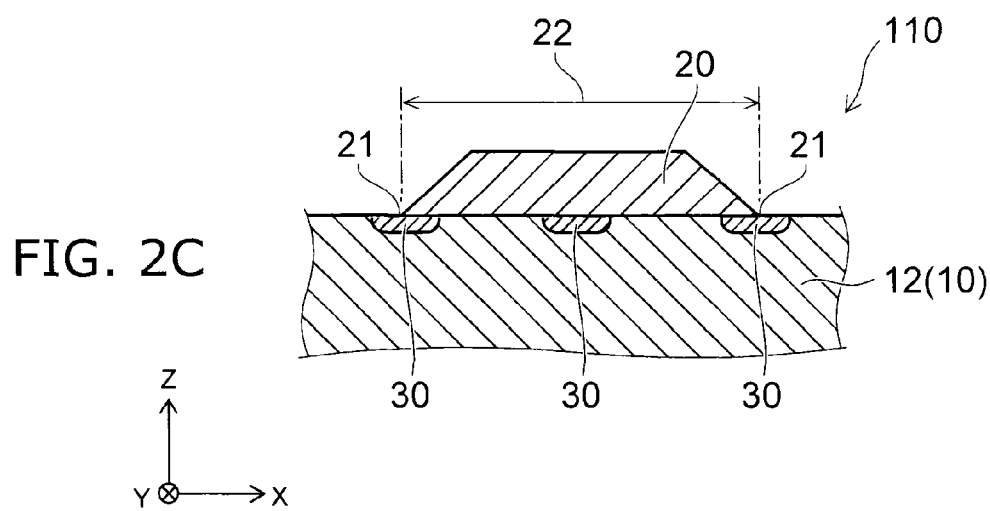

FIGS. 2A to 2C are schematic sectional views illustrating the terminal part and the central part.

FIG. 2A shows a first example of the terminal part 21 and the central part 22. FIG. 2B shows a second example of the terminal part 21 and the central part 22. FIG. 2C shows a third example of the terminal part 21 and the central part 22.

In the first example shown in FIG. 2A, the semiconductor device 110 includes a termination structure region 51. In the first example, part of the termination structure region 51 is provided below the second semiconductor region 20. In this case, the terminal part 21 is a portion of the second semiconductor region 20 in which the second semiconductor region 20 overlaps the termination structure region 51 as viewed in the Z-direction. The central part 22 is a portion of the second semiconductor region 20 inside the terminal part 21.

In the second example shown in FIG. 2B, the semiconductor device 110 includes a termination structure region 51. In the second example, the termination structure region 51 is not provided below the second semiconductor region 20. In this case, the terminal part 21 is an outer peripheral portion of the second semiconductor region 20 at the boundary surface between the second semiconductor region 20 and the first semiconductor region 10. The central part 22 is a portion of the second semiconductor region 20 inside the terminal part 21.

In the third example shown in FIG. 2C, the semiconductor device 110 does not include the termination structure region 51. In this case, the terminal part 21 is similar to that of the second example shown in FIG. 2B. That is, the terminal part 21 is an outer peripheral portion of the second semiconductor region 20 at the boundary surface between the second semiconductor region 20 and the first semiconductor region 10. The central part 22 is a portion of the second semiconductor region 20 inside the terminal part 21. In the semiconductor device 110 not including the termination structure region 51, the third semiconductor region 30 may extend from the central part 22 to the outside of the second semiconductor region 20.

Next, the operation of the semiconductor device 110 is described.

First, the operation is described in the case of applying a (forward) voltage so that the second electrode 80 is made positive relative to the first electrode 70 of the semiconductor device 110. In the case of applying a forward voltage, electrons and holes beyond the built-in potential flow through the p-n junction surface existing at the interface between the $p^+$-type second semiconductor region 20 and the n-type first semiconductor region 10 (e.g., the $n^-$-type first epitaxial growth layer 12). Thus, a current flows in the semiconductor device 110 (forward operation).

Next, the operation is described in the case of applying a (reverse) voltage so that the second electrode 80 is made negative relative to the first electrode 70 of the semiconductor device 110. In the case of applying a reverse voltage, a depletion layer spreads at the p-n junction surface. Thus, little current flows in the semiconductor device 110 (reverse operation).

The third semiconductor region 30 is provided in the semiconductor device 110. Thus, in the semiconductor device 110, the temperature characteristic is shifted to the positive side compared with the case where the third semiconductor region 30 is not provided. During the high temperature operation of the semiconductor device 110, holes and electrons need to migrate via more point defects and impurities. In the semiconductor device 110, the third semiconductor region 30 is provided between the first semiconductor region 10 and the second semiconductor region 20. Thus, in the semiconductor device 110, the on-resistance increases compared with the case where the third semiconductor region 30 is not provided. This shifts the temperature characteristic to the positive side.

In the semiconductor device 110, the temperature characteristic is controlled depending on the volume of the third semiconductor region 30. More specifically, the temperature characteristic is further shifted to the positive side with the increase of the volume of the third semiconductor region 30. Here, the on-resistance of the semiconductor device 110 further increases with the increase of the volume of the third semiconductor region 30. Thus, the volume of the third semiconductor region 30 is determined in view of the balance between the temperature characteristic and the on-resistance.

Figure 3A:
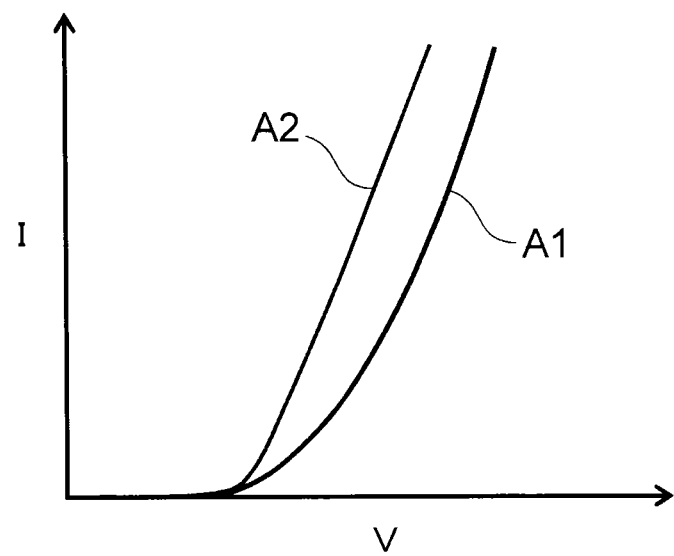
FIGS. 3A and 3B illustrate the current-voltage characteristics of the semiconductor device.
Figure 3B:
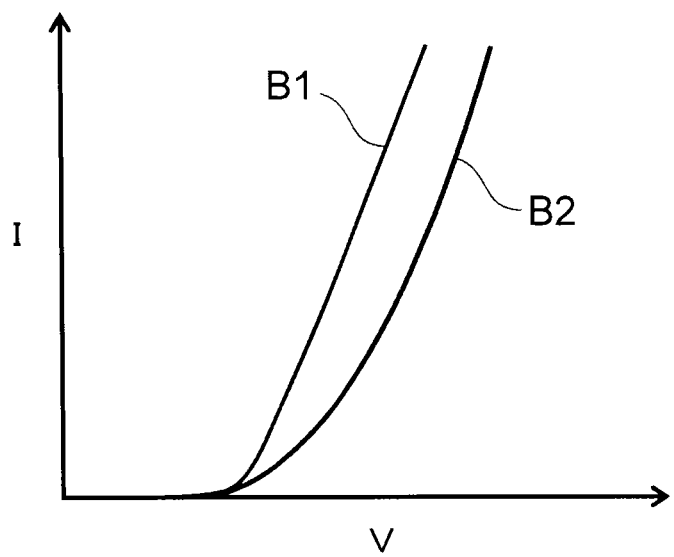

FIGS. 3A and 3B illustrate the current-voltage characteristics of the semiconductor device.

FIG. 3A shows current-voltage (I-V) characteristics A1 and A2 of the semiconductor device not including the third semiconductor region 30. The characteristic A1 represents the I-V characteristic at a first temperature. The characteristic A2 represents the I-V characteristic at a second temperature higher than the first temperature. FIG. 3B shows I-V characteristics B1 and B2 of the semiconductor device including the third semiconductor region 30 entirely between the first semiconductor region 10 and the central part 22. The characteristic B1 represents the I-V characteristic at the first temperature. The characteristic B2 represents the I-V characteristic at the second temperature.

As shown in FIG. 3A, in the semiconductor device not including the third semiconductor region 30, the characteristic A1 turns to the characteristic A2 with the increase from the first temperature to the second temperature. The on-resistance is lower in the characteristic A2 than in the characteristic A1. That is, the semiconductor device not including the third semiconductor region 30 has negative temperature characteristic.

As shown in FIG. 3B, in the semiconductor device including the third semiconductor region 30, the characteristic B1 turns to the characteristic B2 with the increase from the first temperature to the second temperature. The on-resistance is higher in the characteristic B2 than in the characteristic B1. That is, the semiconductor device including the third semiconductor region 30 has positive temperature characteristic.

In the semiconductor device 110 according to the embodiment, the temperature characteristic is adjusted depending on the size of the third semiconductor region 30. More specifically, when the third semiconductor region 30 is made small, the effect of negative temperature characteristic as shown in the characteristics A1 and A2 is strongly exhibited. On the other hand, when the third semiconductor region 30 is made large, the effect of positive temperature characteristic as shown in the characteristics B1 and B2 is strongly exhibited. Thus, the temperature characteristic of the semiconductor device 110 is controlled to the positive and negative side depending on the size of the third semiconductor region 30.

The semiconductor device 110 has a configuration in which the portion for shifting the temperature characteristic to the positive side (the portion provided with the third semiconductor region 30) and the portion for not shifting the temperature coefficient to the positive side (the portion not provided with the third semiconductor region 30) are provided in parallel from the second electrode 80 toward the first electrode 70.

Figure 4A:
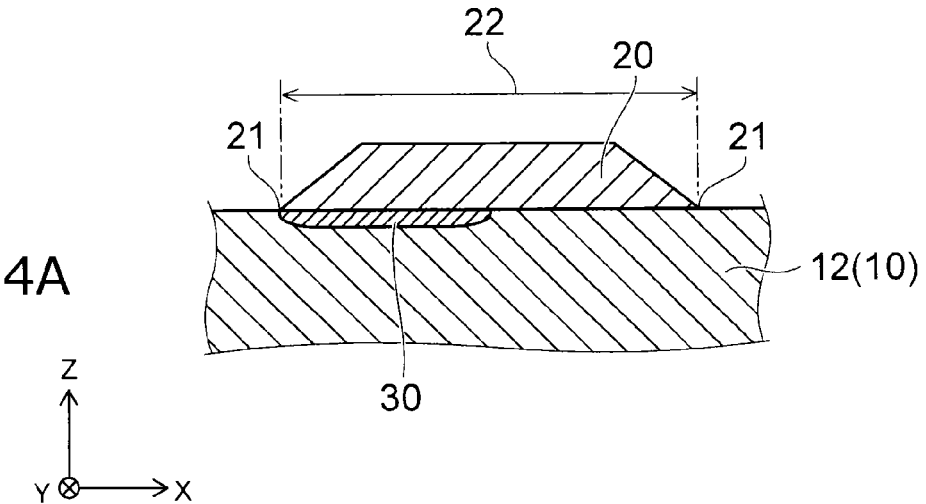
FIGS. 4A and 4B are schematic sectional views illustrating alternative third semiconductor regions.
Figure 4B:
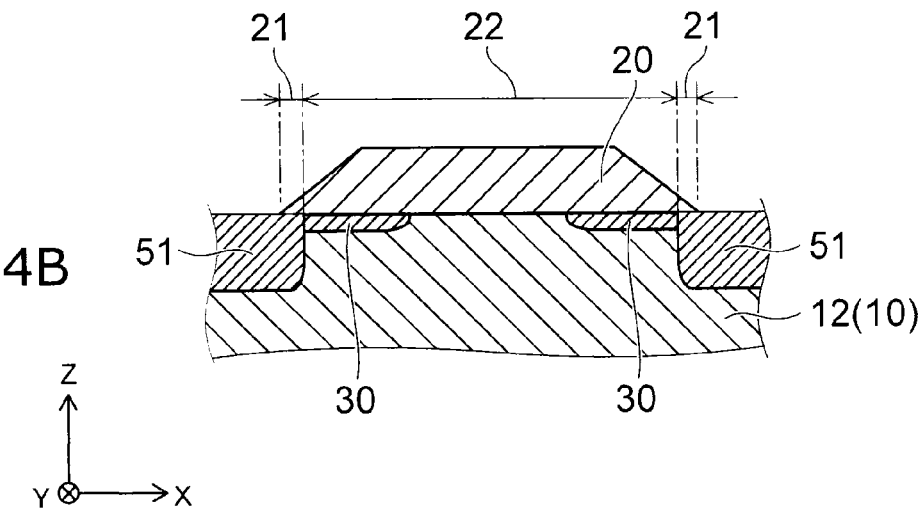

FIGS. 4A and 4B are schematic sectional views illustrating alternative third semiconductor regions.

In the example shown in FIG. 4A, the third semiconductor region 30 is unevenly provided on one side of the center of the second semiconductor region 20. In the example shown in FIG. 4A, the third semiconductor region 30 is provided on one side half with respect to the center of the second semiconductor region 20. Thus, the positive temperature characteristic as shown in FIG. 3B is exhibited on the one side half provided with the third semiconductor region 30. The negative temperature characteristic as shown in FIG. 3A is exhibited on the other side half not provided with the third semiconductor region 30.

In the example shown in FIG. 4B, the third semiconductor region 30 is provided on the outermost side of the central part 22. The example shown in FIG. 4B includes a termination structure region 51. The third semiconductor region 30 is provided adjacent to the termination structure region 51. The third semiconductor region 30 may be provided continuous to the termination structure region 51. However, the thickness of the third semiconductor region 30 is thinner than the thickness of the termination structure region 51. The impurity concentration of the third semiconductor region 30 is lower than the impurity concentration of the termination structure region 51.

Figure 5A:
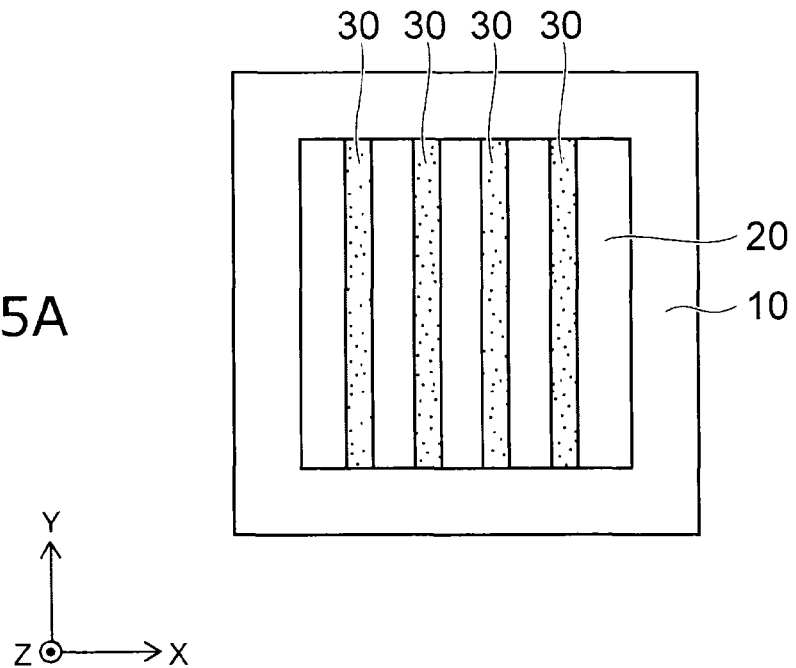
FIGS. 5A and 5B are schematic plan views illustrating the third semiconductor region.
Figure 5B:
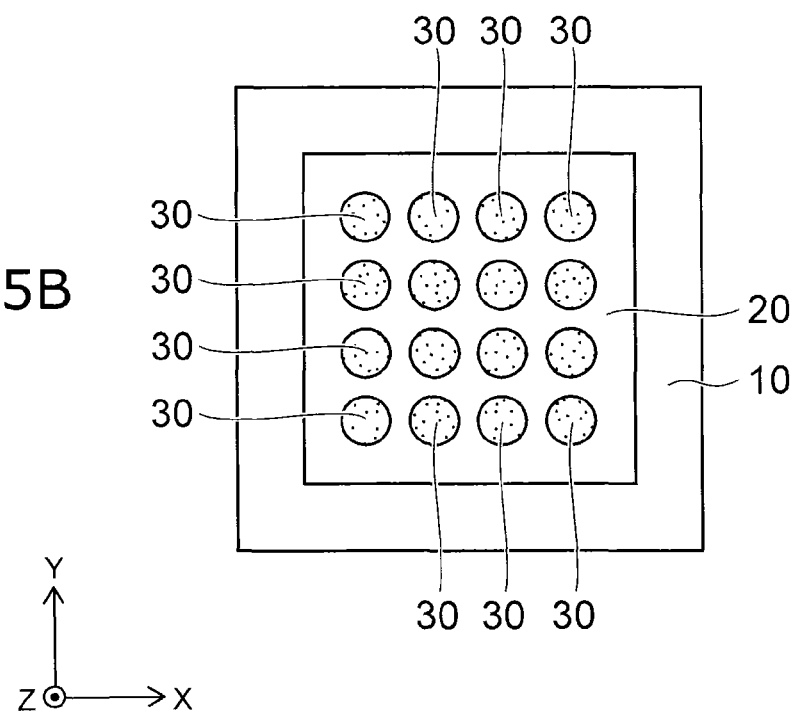

FIGS. 5A and 5B are schematic plan views illustrating the third semiconductor region.

FIGS. 5A and 5B both show schematic plan views as viewed in the Z-direction. In FIGS. 5A and 5B, the outline of the third semiconductor region 30 provided below the second semiconductor region 20 is depicted by solid lines for convenience of description.

In the example shown in FIG. 5A, the third semiconductor region 30 extends in one direction (e.g., Y-direction). The third semiconductor region 30 is provided like a line. In the case where a plurality of third semiconductor regions 30 are provided, the plurality of third semiconductor regions 30 are provided in parallel to each other. The spacing between two adjacent ones of the plurality of third semiconductor regions 30 is preferably equal to the spacing between other two adjacent third semiconductor regions 30. In the example shown in FIG. 5A, the third semiconductor region 30 extends in one direction. However, the third semiconductor region 30 may extend in two or more directions. The plurality of third semiconductor regions 30 may be provided like a lattice.

In the example shown in FIG. 5B, the third semiconductor region 30 is provided like an island. In the case where a plurality of third semiconductor regions 30 are provided, the plurality of third semiconductor regions 30 are interspersed (arranged like dots) along the interface between the first semiconductor region 10 and the second semiconductor region 20. That is, the plurality of third semiconductor regions 30 are spaced from each other.

In the example shown in FIG. 5B, the plurality of third semiconductor regions 30 are equally spaced in mutually orthogonal directions (e.g., X-direction and Y-direction). However, the plurality of third semiconductor regions 30 may be arranged irregularly.

In the case where the plurality of third semiconductor regions 30 are mutually equal in impurity concentration and thickness, the temperature characteristic of the semiconductor device 110 is controlled by the area of the plurality of third semiconductor regions 30 as viewed in the Z-direction. The temperature characteristic of the semiconductor device 110 is appropriately controlled also in the case where the plurality of third semiconductor regions 30 are arranged like lines, dots, lattice and the like as described above.

The structure such as arrangement and depth of the third semiconductor region 30 is detected by e.g. scanning capacitance microscopy (SCM), secondary ion mass spectrometry (SIMS), transmission electron microscopy (TEM), and photoluminescence (PL).

Figure 6A:
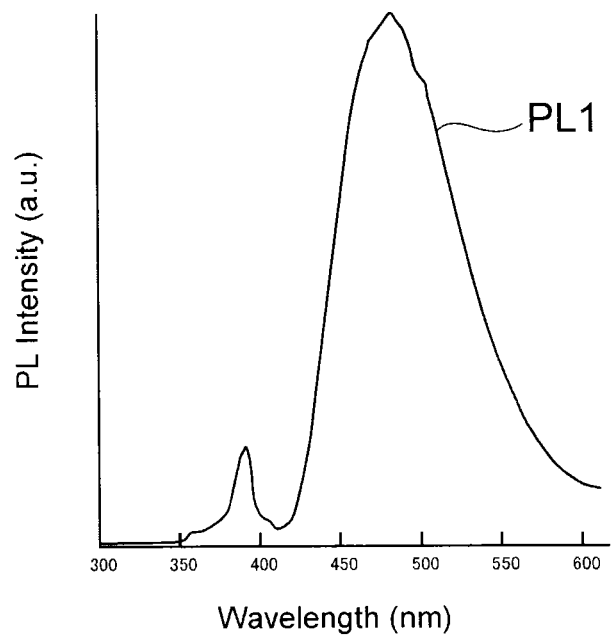
FIGS. 6A and 6B illustrate PL spectra.
Figure 6B:
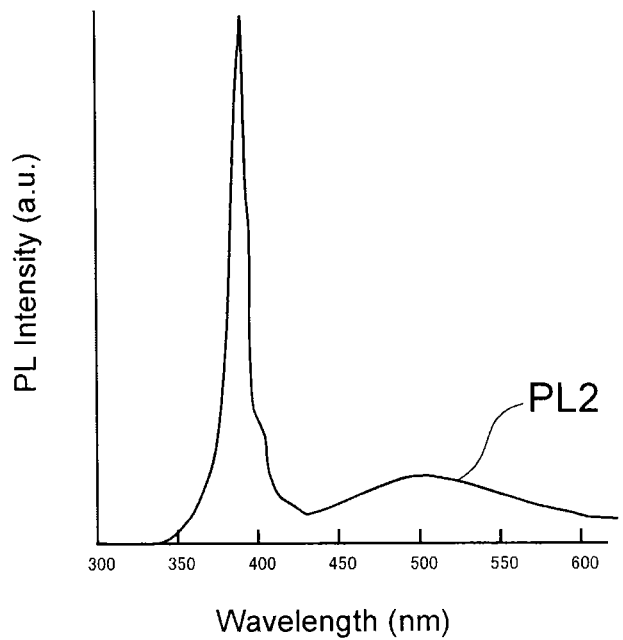

FIGS. 6A and 6B illustrate PL spectra.

FIG. 6A shows a PL spectrum PL1 of the semiconductor device including the third semiconductor region 30. FIG. 6B shows a PL spectrum PL2 of the semiconductor device not including the third semiconductor region 30. In FIGS. 6A and 6B, the horizontal axis represents wavelength (nm), and the vertical axis represents PL intensity (relative value). Here, the light emission near 380 nm shown in FIGS. 6A and 6B is a band edge emission.

FIG. 6A shows the band edge emission and the PL spectrum PL1. In the PL spectrum PL1 shown in FIG. 6A, the intensity of the peak near a wavelength of approximately 500 nm is higher than the intensity of the peak near a wavelength of approximately 380 nm. On the other hand, FIG. 6B shows the band edge emission and the PL spectrum PL2. In the PL spectrum PL2 shown in FIG. 6B, the intensity of the peak near a wavelength of approximately 500 nm is lower than the intensity of the peak near a wavelength of approximately 380 nm. That is, the balance of the intensity of peaks of the PL spectrum varies with the presence or absence of the third semiconductor region 30.

Next, methods for manufacturing the semiconductor device 110 are described.

FIGS. 7A to 8C are schematic sectional views illustrating a method (I) for manufacturing a semiconductor device.

Figure 7A:
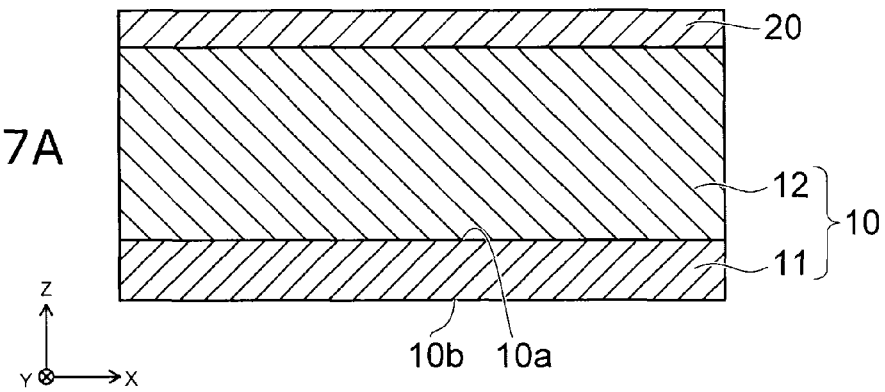
FIGS. 7A to 7C are schematic sectional views illustrating a method (I) for manufacturing a semiconductor device.

First, as shown in FIG. 7A, a SiC bulk substrate 11 fabricated by sublimation technique or the like is prepared. The doping concentration in the substrate 11 is approximately $1 \times 10^{18}$ cm$^{-3}$ or more and $1 \times 10^{20}$ cm$^{-3}$ or less. In the embodiment, the substrate 11 having a doping concentration of $5 \times 10^{18}$ cm$^{-3}$ is taken as an example. The substrate 11 is of n$^+$-type.

Next, an n$^-$-type first epitaxial growth layer 12 is formed on the first surface 10a of the substrate 11. The first epitaxial growth layer 12 is formed on the first surface 10a by e.g. epitaxial growth technique. The doping concentration and the thickness of the n$^-$-type first epitaxial growth layer 12 are designed based on the breakdown voltage and other characteristics of the device. For instance, the doping concentration is approximately $1 \times 10^{14}$ cm$^{-3}$ or more and $1 \times 10^{17}$ cm$^{-3}$ or less. The thickness is approximately 5 μm or more and approximately 250 μm or less. Depending on the doping concentration and the thickness of the first epitaxial growth layer 12, a buffer layer (not shown) having n-type conductivity may be formed between the substrate 11 and the first epitaxial growth layer 12. The doping concentration of the buffer layer may be approximately $5 \times 10^{17}$ cm$^{-3}$ or more and $5 \times 10^{18}$ cm$^{-3}$ or less. The thickness of the buffer layer may be in the range from approximately several μm to several tens of μm. The buffer layer may be formed on the first surface 10a of the substrate 11 by epitaxial growth technique.

Next, a p$^+$-type second semiconductor region 20 is formed on the first epitaxial growth layer 12. The second semiconductor region 20 is formed on the first epitaxial growth layer 12 by e.g. epitaxial growth technique. The second semiconductor region 20 is intended to control the spreading of the depletion layer in the p-n junction portion and to reduce the contact resistance of the surface part. Thus, the second semiconductor region 20 is formed under the growth condition adapted to the target characteristics. The doping concentration of the second semiconductor region 20 is e.g. $1 \times 10^{17}$ cm$^{-3}$ or more and $1 \times 10^{21}$ cm$^{-3}$ or less. The thickness of the second semiconductor region 20 is approximately several μm.

In the second semiconductor region 20, the doping concentration may be changed in the thickness direction (Z-direction). For instance, the doping concentration may be intentionally changed in the thickness direction by changing the condition of impurity concentration in the second semiconductor region 20. In this case, the doping concentration of the surface portion (shallow portion) of the second semiconductor region 20 may be made higher, and the doping concentration of the deep portion may be made lower. The change in the thickness direction of the impurity concentration of the second semiconductor region 20 may be either stepwise or continuous depending on the change of doping concentration.

Figure 7B:
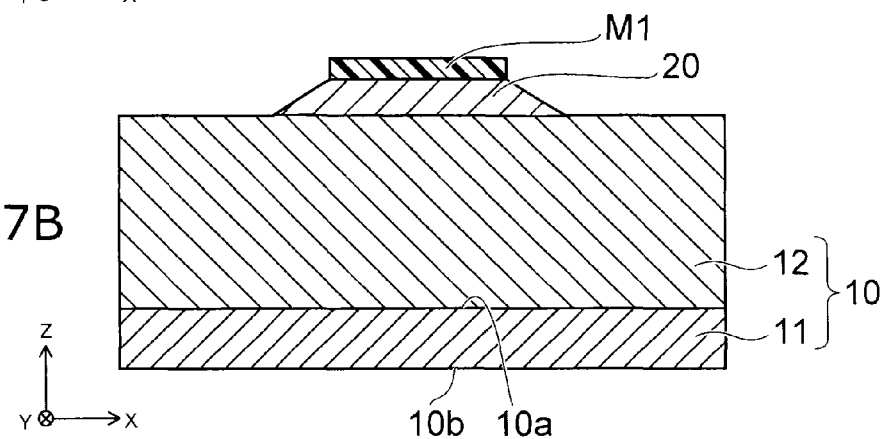

Next, as shown in FIG. 7B, a mask M1 is formed on the central part of the second semiconductor region 20, and the second semiconductor region 20 is processed into a mesa shape. This processing is based on ion etching such as RIE (reactive ion etching). In RIE, etching is performed using a gas based on e.g. fluorine (F) and chlorine (Cl). The etched portion of the second semiconductor region 20 is etched in the entire thickness of the second semiconductor region 20. Thus, the n$^-$-type first epitaxial growth layer 12 is exposed around the second semiconductor region 20 being left unetched.

Figure 7C:
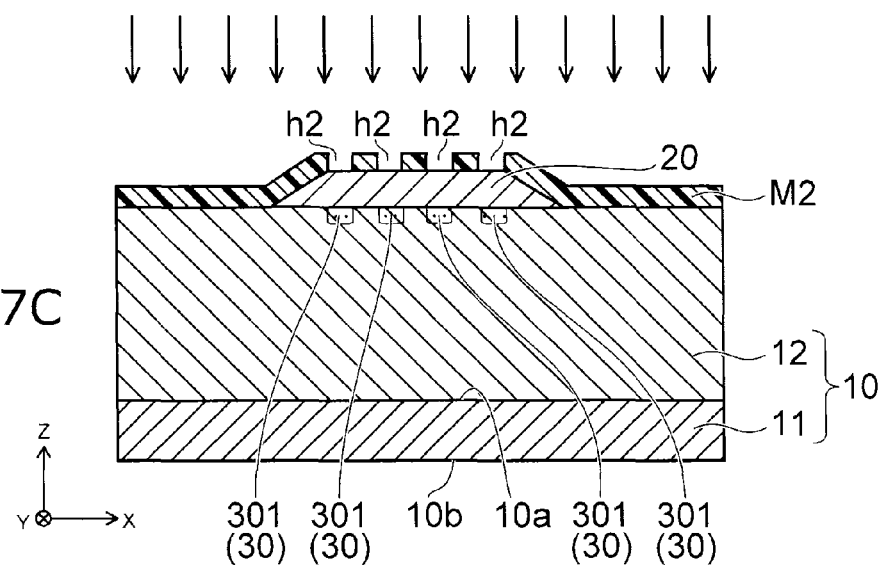

Next, as shown in FIG. 7C, a mask M2 is formed on the exposed first epitaxial growth layer 12 and on the second semiconductor region 20. The mask M2 is formed from an organic material or insulating material such as resist. The mask M2 is provided with an opening h2. The opening h2 is provided on the second semiconductor region 20. The opening h2 is provided in a plurality as necessary. The size and the arrangement of the third semiconductor region 30 are determined by the shape and the arrangement of the opening h2.

Next, ion implantation is performed through the mask M2. An impurity element of the second conductivity type is used as the implanted ion species. For instance, Al or B is used. In the embodiment, Al having high controllability of ion implantation is used. Ions are implanted near the surface of the first epitaxial growth layer 12 below the opening h2 of the mask M2 depending on the condition of ion implantation. The ion-implanted portion 301 turns to a third semiconductor region 30 by heat treatment. The amount of point defects in the third semiconductor region 30 is larger than the amount of point defects in the first epitaxial growth layer 12 without ion implantation.

Next, as shown in FIG. 8A, a termination structure region 51 is formed. The termination structure region 51 can be e.g. a p$^-$-type JTE, RESURF layer, or guard ring layer. In the embodiment, a p$^-$-type JTE is formed. The termination structure region 51 is formed as follows. First, a mask M3 having an opening h3 is formed from an organic material or insulating material such as resist, and ion implantation is performed through the opening h3. Then, heat treatment is performed. Here, a JTE having an impurity concentration of e.g. $5 \times 10^{16}$ cm$^{-3}$ or more and $5 \times 10^{18}$ cm$^{-3}$ or less and a thickness of approximately 0.8 μm or more and 1.0 μm or less is formed by ion implantation.

Next, as shown in FIG. 8B, a channel stopper layer 53 is formed as a portion for preventing the spreading of the potential to the end surface of the p-n junction portion. As in the formation of the termination structure region 51, the channel stopper layer 53 is also formed as follows. A mask M4 having an opening h4 is formed, and ion implantation is performed through the opening h4. Then, heat treatment is performed. Thus, the channel stopper layer 53 is formed around the termination structure region 51. The channel stopper layer 53 is formed with spacing from the termination structure region 51.

The heat treatment for forming the third semiconductor region 30, the termination structure region 51, and the channel stopper layer 53 may be performed collectively.

Next, as shown in FIG. 8C, a first electrode 70 is formed on the second surface 10b of the substrate 11. The first electrode 70 is subjected to heat treatment as necessary. Then, a second electrode 80 is formed on the second semiconductor region 20. The second electrode 80 is subjected to heat treatment as necessary. The material of the first electrode 70 and the material of the second electrode 80 are preferably materials that can form a low-resistance ohmic junction with the semiconductor region in contact therewith.

If the semiconductor regions in contact with the first electrode 70 and the second electrode 80 are made of SiC, and there is no problem with the heat treatment temperature of the first electrode 70 and the heat treatment temperature of the second electrode 80, then the first electrode 70 may be formed after the second electrode 80 is formed. Furthermore, an insulating film, organic film or the like may be formed as necessary around the substrate 11, the first epitaxial growth layer 12, the second semiconductor region 20, the termination structure region 51, and the channel stopper layer 53 to serve to prevent electrical discharge. Thus, the semiconductor device 110 is completed.

In the method (I) for manufacturing the semiconductor device 110, the size and the arrangement of the third semiconductor region 30 can be arbitrarily set by the size and the arrangement of the opening h2 of the mask M2.

FIGS. 9A to 10C are schematic sectional views illustrating a method (II) for manufacturing a semiconductor device.

Figure 9A:
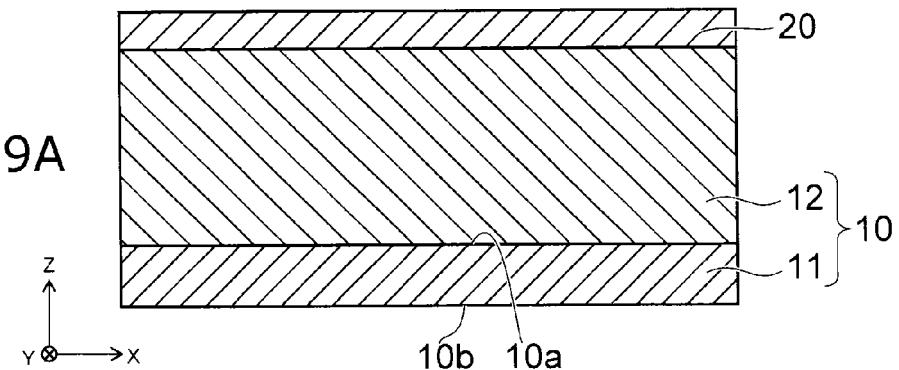
FIGS. 9A to 9C are schematic sectional views illustrating a method (II) for manufacturing a semiconductor device.

First, as shown in FIG. 9A, as in the example shown in FIG. 7A, a substrate 11 is prepared. A first epitaxial growth layer 12 is formed on the substrate 11. A second semiconductor region 20 is formed on the first epitaxial growth layer 12.

Figure 9B:
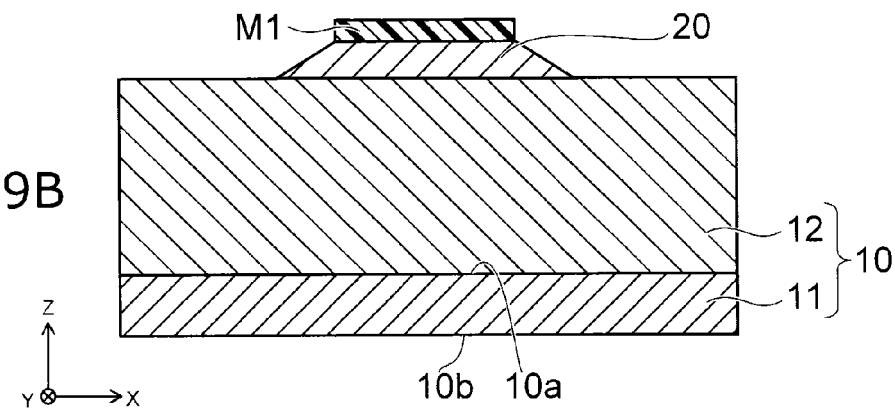

Next, as shown in FIG. 9B, as in the example shown in FIG. 7B, a mask M1 is formed, and the second semiconductor region 20 is processed into a mesa shape.

Figure 9C:
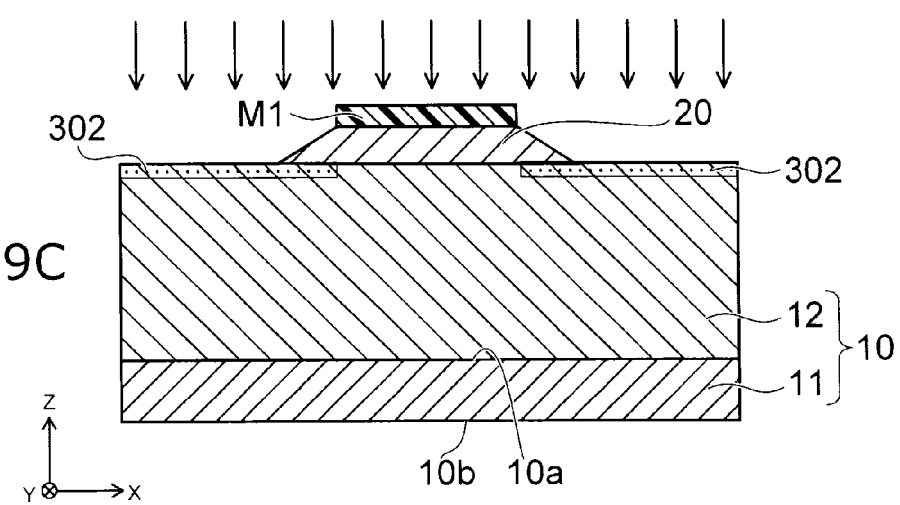

Next, as shown in FIG. 9C, ion implantation is performed through the mask M1 used to process the second semiconductor region 20 into a mesa shape. An impurity element of the second conductivity type is used as the implanted ion species. For instance, Al or B is used. In the embodiment, Al having high controllability of ion implantation is used. Ions are implanted near the surface of the first epitaxial growth layer 12 other than the mask M1 as viewed in the Z-direction depending on the condition of ion implantation. Thus, an ion-implanted region 302 is formed.

Figure 10A:
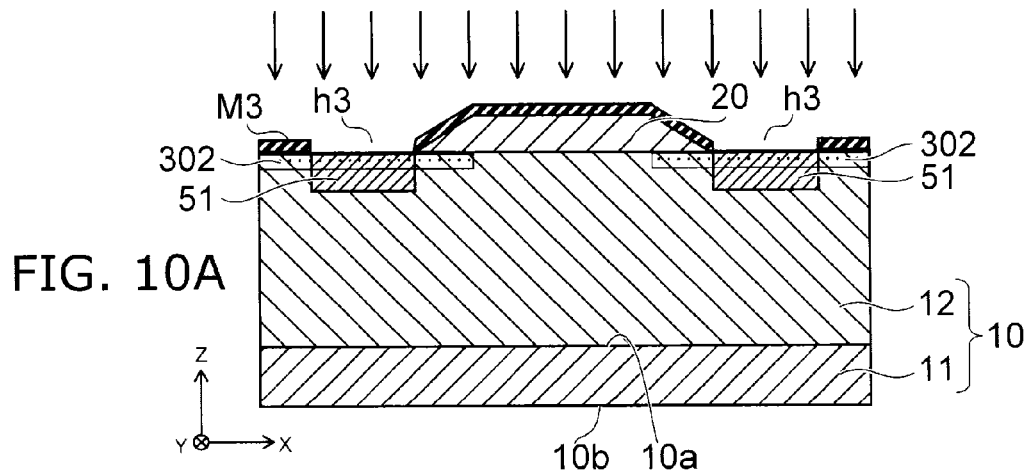
FIGS. 10A to 10C are schematic sectional views illustrating a method (II) for manufacturing a semiconductor device.
Figure 10B:
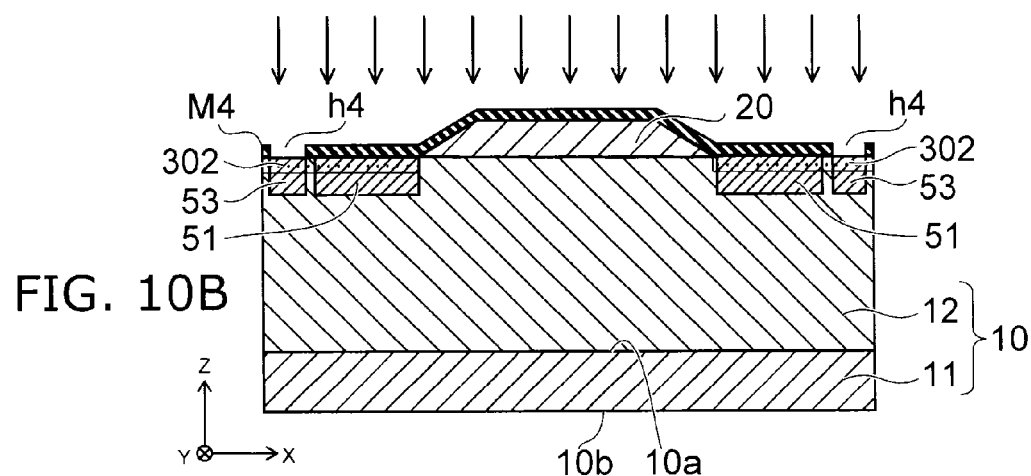

Next, as shown in FIG. 10A, as in the example shown in FIG. 8A, a mask M3 is formed, and a termination structure region 51 is formed. Furthermore, as shown in FIG. 10B, as in the example shown in FIG. 8B, a mask M4 is formed, and a channel stopper layer 53 is formed.

Figure 10C:
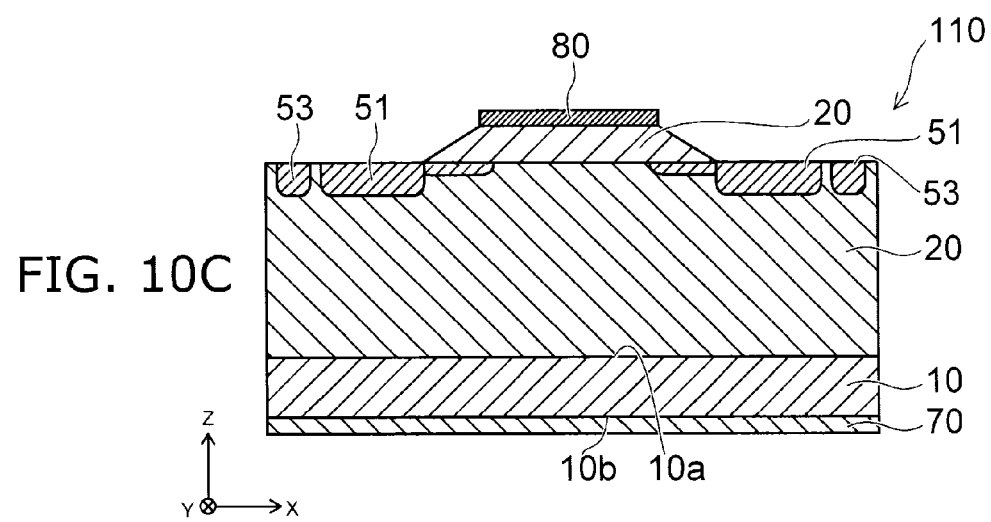

Next, heat treatment is performed to activate ions in the ion-implanted region 302. Thus, the third semiconductor region 30 as shown in FIG. 10C is formed. Next, as in the example shown in FIG. 8C, a first electrode 70 and a second electrode 80 are formed. Thus, the semiconductor device 110 is completed.

In the method (II) for manufacturing the semiconductor device 110, the mask M1 used to form the second semiconductor region 20 into a mesa shape is used to perform ion implantation for forming the third semiconductor region 30. This eliminates the need to form a mask M2 used in the method (I) for manufacturing the semiconductor device 110.

Figure 11A:
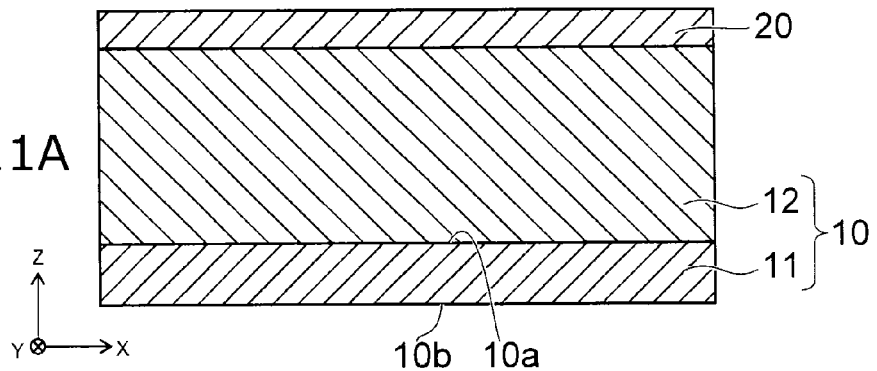
FIGS. 11A to 11C are schematic sectional views illustrating a method (III) for manufacturing the semiconductor device 110.
Figure 11B:
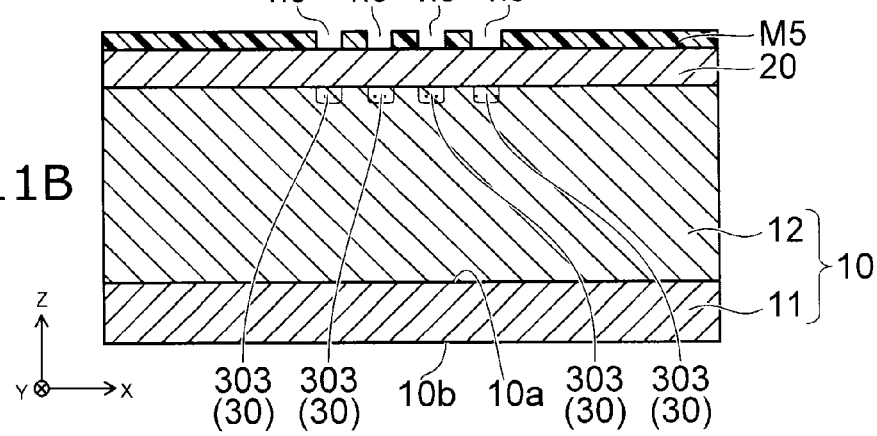
Figure 11C:
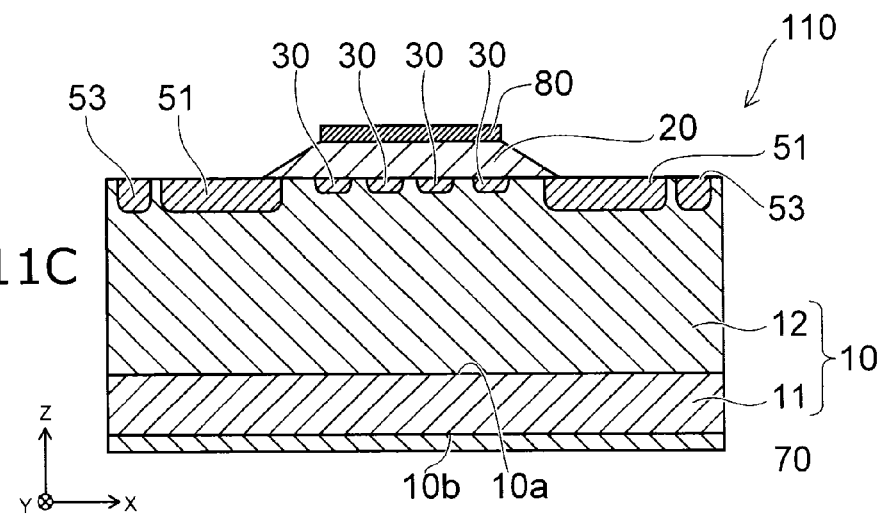

FIGS. 11A to 11C are schematic sectional views illustrating a method (III) for manufacturing the semiconductor device 110.

First, as shown in FIG. 9A, as in the example shown in FIG. 7A, a substrate 11 is prepared. A first epitaxial growth layer 12 is formed on the substrate 11. A second semiconductor region 20 is formed on the first epitaxial growth layer 12.

Next, as shown in FIG. 11B, a mask M5 is formed on the second semiconductor region 20. The mask M5 is formed from an organic material or insulating material such as resist. The mask M5 is provided with an opening h5. The opening h5 is provided in a plurality as necessary. The size and the arrangement of the third semiconductor region 30 are determined by the shape and the arrangement of the opening h5.

Next, ion implantation is performed through the mask M5. An impurity element of the second conductivity type is used as the implanted ion species. For instance, Al or B is used. In the embodiment, Al having high controllability of ion implantation is used. Ions are implanted near the surface of the first epitaxial growth layer 12 below the opening h5 of the mask M5 depending on the condition of ion implantation. The ion-implanted portion 303 turns to a third semiconductor region 30 by heat treatment. The amount of point defects in the third semiconductor region 30 is larger than the amount of point defects in the first epitaxial growth layer 12 without ion implantation.

The subsequent process is similar to the example shown in FIGS. 8A to 8C. Thus, the semiconductor device 110 is completed as shown in FIG. 11C. In the method (III) for manufacturing the semiconductor device 110, the size and the arrangement of the third semiconductor region 30 can be arbitrarily set by the size and the arrangement of the opening h5 of the mask M5. Furthermore, the mask M5 is formed on the flat second semiconductor region 20. Thus, the mask M5 can be formed with high accuracy. Thus, the size and the arrangement of the third semiconductor region 30 can be controlled with high accuracy.

Second Embodiment

Next, a semiconductor device according to a second embodiment is described.

Figure 12:
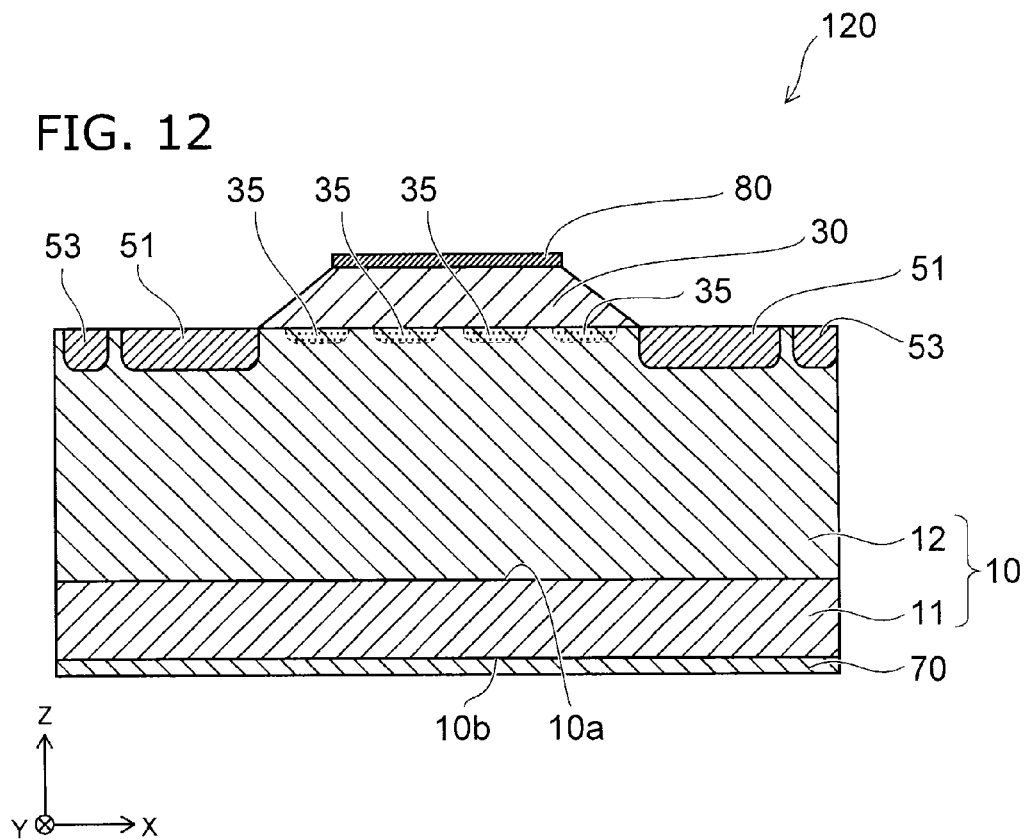
FIG. 12 is a schematic sectional view illustrating the configuration of a semiconductor device according to a second embodiment.

FIG. 12 is a schematic sectional view illustrating the configuration of a semiconductor device according to the second embodiment.

As shown in FIG. 12, the semiconductor device 120 according to the embodiment includes a first semiconductor region 10, a second semiconductor region 20, and an antisite region 35. The semiconductor device 120 further includes a first electrode 70 and a second electrode 80. The semiconductor device 120 is e.g. a P-N diode. In the semiconductor device 120, the antisite region 35 is provided instead of the third semiconductor region 30 of the semiconductor device 110. In the semiconductor device 120, the configuration other than the antisite region 35 is similar to that of the semiconductor device 110.

The antisite region 35 is provided between the first semiconductor region 10 and the second semiconductor region 20. The antisite region 35 includes more antisites of C or Si than the first semiconductor region 10. In the antisite region 35 including SiC, for instance, Si of the Si site is replaced by C. Alternatively, C of the C site may be replaced by Si.

In the antisite region 35, Si or C is used instead of the ion species used in the ion implantation for forming the third semiconductor region 30 in the semiconductor device 110. The resistance per unit volume of the antisite region 35 is higher than the resistance per unit volume of the first semiconductor region 10. The resistance of the antisite region 35 is higher at a higher temperature.

The semiconductor device 120 including the antisite region 35 achieves functions and effects similar to those of the semiconductor device 110 including the third semiconductor region 30. That is, the antisite region 35 is provided in the semiconductor device 120. Thus, in the semiconductor device 120, the temperature characteristic is shifted to the positive side compared with the case where the antisite region 35 is not provided.

In the semiconductor device 120, the temperature characteristic is adjusted depending on the size of the antisite region 35. More specifically, when the antisite region 35 is made small, the effect of negative temperature characteristic is strongly exhibited. On the other hand, when the antisite region 35 is made large, the effect of positive temperature characteristic is strongly exhibited. Thus, the temperature characteristic of the semiconductor device 120 is controlled to the positive and negative side depending on the size of the antisite region 35.

Third Embodiment

Next, a semiconductor device according to a third embodiment is described.

Figure 13:
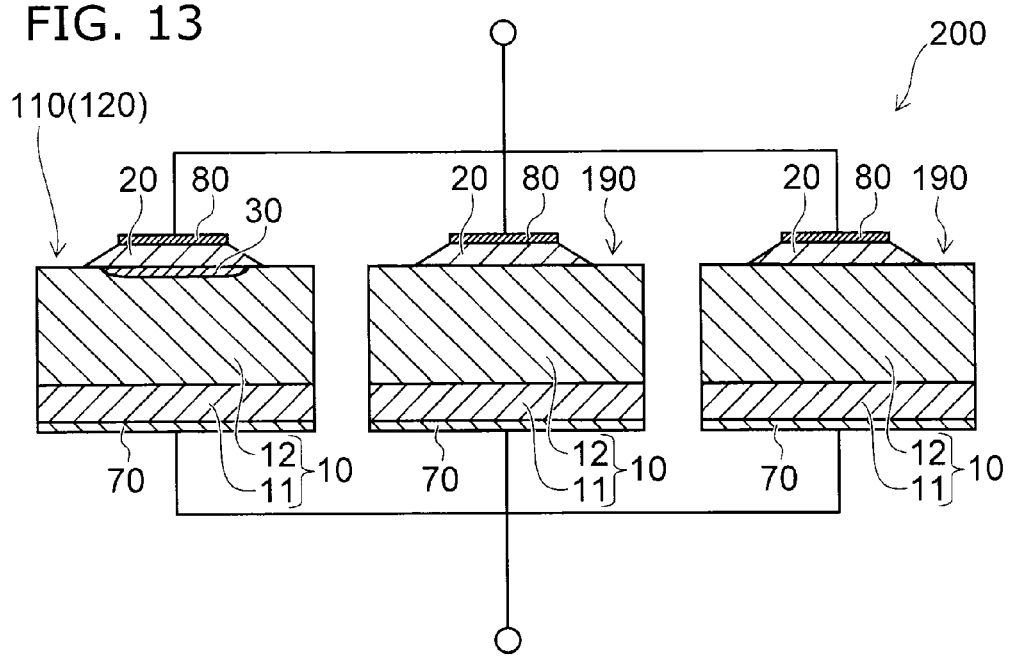
FIG. 13 is a schematic view illustrating the configuration of a semiconductor device according to a third embodiment.

FIG. 13 is a schematic view illustrating the configuration of a semiconductor device according to the third embodiment.

As shown in FIG. 13, the semiconductor device 200 according to the embodiment includes a semiconductor device 110 including the third semiconductor region 30 and a semiconductor device 190 not including the third semiconductor region. The semiconductor device 110 is connected in parallel to the semiconductor device 190.

In the example shown in FIG. 13, the semiconductor device 200 includes one semiconductor device 110 and two semiconductor devices 190. The one semiconductor device 110 and the two semiconductor devices 190 are connected in parallel to each other. The semiconductor device 200 as a whole constitutes one P-N diode by parallel connection of a plurality of P-N diodes.

The temperature characteristic of the semiconductor device 110 is shifted to the positive side further than the temperature characteristic of the semiconductor device 190. Thus, by connecting the semiconductor device 110 in parallel to the semiconductor device 190, the temperature characteristic of the semiconductor device 200 is shifted to the positive side compared with the case where the semiconductor device 110 is not connected in parallel.

In the semiconductor device 200, the temperature characteristic is adjusted by the number of semiconductor devices 110 among a plurality of semiconductor devices 110, 190. In the example described above, the semiconductor device 110 is used in the semiconductor device 200. However, the semiconductor device 120 may be used instead of the semiconductor device 110.

As described above, the semiconductor device and the method for manufacturing the same according to the embodiments can achieve stable characteristics against the change of temperature. The embodiments provide a semiconductor device and a method for manufacturing the same that can achieve stable characteristics against the change of temperature.

Although the embodiment and modifications thereof are described above, the invention is not limited to these examples. For example, additions, deletions, or design modifications of components or appropriate combinations of the features of the embodiments appropriately made by one skilled in the art in regard to the embodiments or the modifications thereof described above are within the scope of the invention to the extent that the purport of the invention is included.

In the embodiments described above, the first conductivity type is n-type, and the second conductivity type is p-type. However, the invention is practicable also when the first conductivity type is p-type and the second conductivity type is n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor region of a first conductivity type, the first semiconductor region including silicon carbide;
a second semiconductor region of a second conductivity type, the second semiconductor region including silicon carbide; and
a third semiconductor region of the second conductivity type provided between a part of the first semiconductor region and a part of the second semiconductor region, the third semiconductor region including silicon carbide,
another part of the first semiconductor region contacting another part of the second semiconductor region, and
an amount of point defects in the third semiconductor region being larger than an amount of point defects in the first semiconductor region.

2. A semiconductor device comprising:
a first semiconductor region of a first conductivity type, the first semiconductor region including silicon carbide;
a second semiconductor region of a second conductivity type, the second semiconductor region including silicon carbide;
a third semiconductor region of the second conductivity type provided between a part of the first semiconductor region and a part of the second semiconductor region, the third semiconductor region including silicon carbide; and
a termination structure region of the second conductivity type,
another part of the first semiconductor region contacting another part of the second semiconductor region,
at least a part of the termination structure region being provided between the first semiconductor region and a terminal part of the second semiconductor region, and wherein an impurity concentration of the termination structure region is higher than an impurity concentration of the third semiconductor region.

3. The device according to claim 2, wherein the impurity concentration of the termination structure region is $5 \times 10^{16}$ per cubic centimeter or more and $5 \times 10^{18}$ per cubic centimeter or less.

4. The device according to claim 2, wherein a thickness of the termination structure region is 0.3 micrometers or more and 1.0 micrometer or less.

5. The device according to claim 1, wherein an impurity concentration of the third semiconductor region is equal to an impurity concentration of the second semiconductor region.

6. The device according to claim 2, wherein an amount of point defects in the third semiconductor region is larger than an amount of point defects in the first semiconductor region.

7. The device according to claim 1, wherein the third semiconductor region extends along an interface between the first semiconductor region and the second semiconductor region.

8. The device according to claim 1, wherein the third semiconductor region is provided in an island configuration.

9. The device according to claim 1, wherein
the third semiconductor region is provided in a plurality, and
the plurality of third semiconductor regions are interspersed along an interface between the first semiconductor region and the second semiconductor region.

10. The device according to claim 1, wherein
the third semiconductor region is provided in a plurality, and
the plurality of third semiconductor regions are equally spaced in a first direction and a second direction orthogonal to each other along an interface between the first semiconductor region and the second semiconductor region.

11. The device according to claim 1, wherein an impurity concentration of the third semiconductor region is $1 \times 10^{17}$ per cubic centimeter or more and $1 \times 10^{21}$ per cubic centimeter or less.

12. The device according to claim 1, wherein a thickness of the third semiconductor region is thicker than 0 micrometers and 0.6 micrometers or less.

13. The device according to claim 1, wherein the third semiconductor region includes at least one selected from a group consisting of aluminum and boron.

14. The device according to claim 1, wherein an impurity concentration of the second semiconductor region is $1 \times 10^{17}$ per cubic centimeter or more and $1 \times 10^{21}$ per cubic centimeter or less.

15. The device according to claim 1, wherein a resistance per unit volume of the third semiconductor region is higher than a resistance per unit volume of the first semiconductor region.

16. A semiconductor device comprising:
a first semiconductor region of a first conductivity type, the first semiconductor region including silicon carbide;
a second semiconductor region of a second conductivity type, the second semiconductor region including silicon carbide; and
a third semiconductor region of the second conductivity type provided between the first semiconductor region and the second semiconductor region, the third semiconductor region including silicon carbide, as viewed in a direction connecting the first semiconductor region and the second semiconductor region, an area of an overlapping region of the second semiconductor region and the third semiconductor region being smaller than an area of an overlapping region of the first semiconductor region and the second semiconductor region, wherein an amount of point defects in the third semiconductor region is larger than an amount of point defects in the first semiconductor region.

17. A semiconductor device comprising:
a first semiconductor region of a first conductivity type, the first semiconductor region including silicon carbide;
a second semiconductor region of a second conductivity type, the second semiconductor region including silicon carbide; and
a third semiconductor region of the second conductivity type provided between the first semiconductor region and the second semiconductor region, the third semiconductor region including silicon carbide,
as viewed in a direction connecting the first semiconductor region and the second semiconductor region, an area of an overlapping region of the second semiconductor region and the third semiconductor region being smaller than an area of an overlapping region of the first semiconductor region and the second semiconductor region,
wherein a density of point defects in the third semiconductor region is higher than a density of point defects in the first semiconductor region.

18. A semiconductor device comprising:
a first semiconductor region of a first conductivity type, the first semiconductor region including silicon carbide;
a second semiconductor region of a second conductivity type, the second semiconductor region including silicon carbide; and
a third semiconductor region of the second conductivity type provided between the first semiconductor region and the second semiconductor region, the third semiconductor region including silicon carbide,
as viewed in a direction connecting the first semiconductor region and the second semiconductor region, an area of an overlapping region of the second semiconductor region and the third semiconductor region being smaller than an area of an overlapping region of the first semiconductor region and the second semiconductor region,
wherein a photoluminescence spectrum of the third semiconductor region is different from a photoluminescence spectrum of the first semiconductor region.

19. The device according to claim 18, wherein:
the photoluminescence spectrum of the third semiconductor region has a first strength at 380 nanometers and a second strength at 500 nm,
the photoluminescence spectrum of the first semiconductor region has a third strength at 380 nanometers and a fourth strength at 500 nm, and
a ratio of the second strength to the first strength is higher than a ratio of the fourth strength to the third strength.

\* \* \* \* \*